United States Patent
Xiong et al.

(10) Patent No.: US 9,359,668 B2
(45) Date of Patent: Jun. 7, 2016

(54) FEEDER SYSTEM AND METHOD FOR A VAPOR TRANSPORT DEPOSITION SYSTEM

(75) Inventors: Gang Xiong, Perrysburg, OH (US); Feng Liao, Perrysburg, OH (US); Rick C. Powell, Ann Arbor, MI (US)

(73) Assignee: First Solar, Inc., Perrysburg, OH (US)

( * ) Notice: Subject to any disclaimer, the term of this patent is extended or adjusted under 35 U.S.C. 154(b) by 267 days.

(21) Appl. No.: 13/601,512

(22) Filed: Aug. 31, 2012

(65) Prior Publication Data

US 2013/0058728 A1 Mar. 7, 2013

Related U.S. Application Data

(60) Provisional application No. 61/530,655, filed on Sep. 2, 2011.

(51) Int. Cl.
B65G 53/40 (2006.01)
C23C 14/22 (2006.01)

(52) U.S. Cl.
CPC .................. *C23C 14/228* (2013.01)

(58) Field of Classification Search
USPC .............. 406/75, 12, 46, 86, 123, 134, 146
See application file for complete search history.

(56) References Cited

U.S. PATENT DOCUMENTS

| | | | | |
|---|---|---|---|---|
| 2,900,138 A * | 8/1959 | Strate | ............... | 239/61 |
| 3,186,770 A * | 6/1965 | O'Neal | ............... | 406/30 |
| 3,976,332 A * | 8/1976 | Fabel | ............... | 406/14 |
| 4,305,210 A * | 12/1981 | Christensen et al. | ......... | 34/583 |
| 4,411,674 A * | 10/1983 | Forgac | ............... | 55/304 |
| 4,412,762 A * | 11/1983 | Lepley et al. | ............ | 406/134 |
| 4,763,681 A | 8/1988 | Cuny et al. | | |
| 4,900,199 A * | 2/1990 | Spaulding et al. | ........ | 406/14 |
| 4,901,759 A | 2/1990 | Bellows | | |
| 5,149,229 A * | 9/1992 | Gericke et al. | ............ | 406/75 |
| 5,356,608 A | 10/1994 | Gebhardt | | |
| 5,478,172 A * | 12/1995 | Oura et al. | .............. | 406/23 |
| 5,944,049 A | 8/1999 | Beyer et al. | | |
| 6,151,557 A | 11/2000 | Broden et al. | | |
| 6,183,169 B1 * | 2/2001 | Zhu et al. | ............... | 406/123 |
| 6,216,726 B1 | 4/2001 | Brown et al. | | |
| 6,302,130 B1 | 10/2001 | Ohmi et al. | | |
| 6,379,086 B1 * | 4/2002 | Goth | ............... | 406/75 |
| 6,422,257 B1 | 7/2002 | Baker, Jr. | | |
| 6,450,200 B1 | 9/2002 | Ollivier | | |
| 6,568,416 B2 | 5/2003 | Tucker et al. | | |
| 6,591,850 B2 | 7/2003 | Rocha-Alvarez et al. | | |
| 6,758,233 B2 | 7/2004 | Sulatisky et al. | | |
| 6,814,096 B2 | 11/2004 | Vyers et al. | | |
| 6,971,786 B2 * | 12/2005 | Krambrock | ............ | 366/165.1 |
| 6,997,202 B2 | 2/2006 | Olander | | |

(Continued)

FOREIGN PATENT DOCUMENTS

| | | |
|---|---|---|
| CN | 1291241 A | 4/2001 |
| DE | 42 42 630 A1 | 5/1994 |
| JP | 11-33390 A | 2/1999 |

*Primary Examiner* — Joseph Dillon, Jr.
(74) *Attorney, Agent, or Firm* — Blank Rome LLP

(57) ABSTRACT

An improved feeder system and method for a vapor transport deposition system that includes a carrier gas bypass flow line to allow for continuous carrier gas flow to a vaporizer unit when a vibratory unit which supplies powdered material and carrier gas to the vaporizer unit is out of service. A process gas flow line to the vibratory unit may be included when the powdered material contains a powdered dopant in the material mix.

17 Claims, 3 Drawing Sheets

(56) References Cited

U.S. PATENT DOCUMENTS

| | | | |
|---|---|---|---|
| 7,041,341 B2* | 5/2006 | Ahn | C23C 16/407 118/723 R |
| 7,134,618 B2* | 11/2006 | Harutyunyan et al. | 239/654 |
| 7,174,263 B2 | 2/2007 | Shajii et al. | |
| 7,191,807 B2* | 3/2007 | DeMaison et al. | 141/83 |
| 7,335,396 B2 | 2/2008 | Carpenter et al. | |
| 7,383,851 B2 | 6/2008 | Jacobsen et al. | |
| 7,716,993 B2 | 5/2010 | Ozawa et al. | |
| 7,814,922 B2 | 10/2010 | Tollner | |
| 7,881,886 B1 | 2/2011 | Shareef et al. | |
| 7,883,745 B2 | 2/2011 | Marsh et al. | |
| 7,955,031 B2* | 6/2011 | Powell et al. | 406/75 |
| 8,523,496 B2* | 9/2013 | Bartek | 406/197 |
| 8,550,752 B2* | 10/2013 | Harutyunyan et al. | 406/138 |
| 2006/0032440 A1 | 2/2006 | Nolan | |
| 2007/0001326 A1* | 1/2007 | Toda | C23C 16/4481 261/155 |
| 2008/0208504 A1 | 8/2008 | Hashizume et al. | |
| 2008/0226400 A1* | 9/2008 | Markowski et al. | 406/75 |
| 2009/0301567 A1 | 12/2009 | Lane et al. | |
| 2010/0070240 A1 | 3/2010 | Yasuda et al. | |
| 2010/0178423 A1 | 7/2010 | Shimizu et al. | |
| 2010/0252121 A1 | 10/2010 | Saito et al. | |
| 2013/0089948 A1* | 4/2013 | Xiong | C23C 14/0629 438/102 |
| 2013/0130475 A1* | 5/2013 | Barden | H01L 21/02562 438/478 |
| 2013/0203202 A1* | 8/2013 | Xiong | H01L 31/18 438/57 |

* cited by examiner

FEEDER SYSTEM AND METHOD FOR A VAPOR TRANSPORT DEPOSITION SYSTEM

CROSS-SECTION TO RELATED APPLICATION

The present application claims priority to Provisional Application No. 61/530,655 filed Sep. 2, 2011, the entirety of which is incorporated by reference.

FIELD OF THE INVENTION

Disclosed embodiments relate to the field of photovoltaic device production, and more particularly to a feeder system for a vapor transport deposition (VTD) system and methods of use thereof.

BACKGROUND OF THE INVENTION

Photovoltaic devices can include semiconductor material deposited over a substrate using various production systems; for example, cadmium sulfide (CdS) or cadmium telluride (CdTe) thin films are deposited over a substrate using a VTD system. A typical VTD system may use a powder delivery unit, a powder vaporization and distribution unit, and a vacuum deposition unit. The powder delivery unit may include a vibratory powder feeder.

Vibratory powder feeders are designed to deliver raw material powder to the vaporizer unit. In conventional vibratory powder feeders, raw semiconductor material powder is loaded into the feeder. A controlled amount of carrier gas is directed into the feeder to facilitate the flow of powder. The powder and carrier gas then flow to the vaporizer unit. The carrier gas is typically inert and does not chemically react with the powder. The purpose of the carrier gas is to facilitate transport of the powder to the vaporizer unit.

FIG. 1 illustrates an example of a conventional vapor transport deposition system 11 for delivering and depositing a semiconductor material, for example, CdTe onto a substrate 13, for example, a glass substrate used in the manufacture of thin film solar modules. A vaporizer unit 15 has walls formed of a resistive material which can be heated by AC power source 29 and vaporizes CdTe semiconductor material powder received at opposite ends of vaporizer unit 15 through respective inlets 17 and 19 which receive the semiconductor material powder from respective vibratory powder feeders 21 and 23. Inert carrier gas sources 25 and 27, for example, Helium gas (He) sources, respectively provide a carrier gas to the powder feeders 21 and 23 to transport the semiconductor material through inlets 17 and 19 to the vaporizer unit which vaporizes the semiconductor material powder for deposition of the semiconductor material onto substrate 13. More detailed examples of vapor transport deposition systems of the type illustrated in FIG. 1 can be found in U.S. Pat. Nos. 5,945,165, 6,037,241, and 7,780,787, all assigned to First Solar, Inc.

The heating of the vaporizer unit 15 is not uniform along its length because the vaporizer unit 15 is formed of three separate sections of resistivity material, e.g., SiC, which are connected together along the length of the vaporizer unit 15. Thus, as shown in FIG. 2A, a hot zone is provided by section 31 throughout most of the length of vaporizer unit 15, while a lower temperature colder zone is provided at respective ends of vaporizer unit 15 by section 33. As a consequence, some of the vaporized semiconductor material condenses and accumulates in the colder zones as condensed semiconductor material 35. When the carrier gas source 25 or 27 is turned off during powder refills or for maintenance of one or both of the powder feeders 21 and 23, the built up condensed semiconductor material 35 can resublimate and back diffuse into the inlets 17 and 19 causing a clog, as illustrated in FIG. 2B. Unclogging the inlets 17 and 19 is time consuming and costly. In addition, when one or both of the carrier gas sources 25 and 27 are turned off, the partial pressures of reactive species, such as oxygen ($O_2$) and vaporized water ($H_2O$), within the vapor transport deposition system can change. When one or both of the carrier gas sources 25 and 27 are then turned on, the gas ambient for coating deposition is different from what it was before one or both of the carrier gas source 25 and 27 was turned off. This produces an unstable flow field and gas composition. When flow of the carrier gas source 25 or 27 resumes, the unstable flow field and gas composition causes deposition variations on substrate 13.

Furthermore, it may be desirable for certain depositions to introduce a dopant into the semiconductor material which can react with semiconductor material and form a vapor phase compound within vaporizer unit 15 during the deposition process. To provide for this doping, a process gas, such as feeder compressed dry air ($O_2$), is also introduced into the vaporizer 15 to provide a reactive mix with the dopant. Introduction of the dopant and process gas into vaporizer unit 15 can cause formation of a gas phase product and a solid phase product. While the gas can pass through the porous walls of vaporizer unit 15 for deposition on a substrate 13 (FIG. 1), the solid can not and is confined within the vaporizer causing vaporizer pore clogging. Controlling the flow of process gas into the vaporizer 15 provides a mechanism to adjust doping concentration by controlling the dopant, process gas reaction. This doping concentration control is important for the manufacturing process. Accordingly, a controlled flow of reaction gas and dopant which favors formation of a gaseous product over a solid product needs to be established and maintained to carry out doping of semiconductor depositions and avoid vaporizer pore clogging.

An improved feeder system which reduces the impact of the noted problems is desirable.

DETAILED DESCRIPTION OF THE INVENTION

In the following detailed description, reference is made to the accompanying drawings which form a part hereof, and which illustrate specific embodiments of the invention. These embodiments are described in sufficient detail to enable those of ordinary skill in the art to make and use them. It is also understood that structural, logical, or procedural changes may be made to the specific embodiments disclosed herein.

According to one example embodiment, an improved feeder system and method are provided which includes a carrier gas bypass line. The carrier gas bypass line allows continuous flow of carrier gas to the vaporizer unit during refill or maintenance of an associated vibratory powder feeder. Continuous flow of carrier gas to the vaporizer unit prevents clogging of inlets into the vaporizer unit and maintains a stable flow field within the vaporizer unit.

Also, in another example embodiment where Si doping of a semiconductor material is employed, the vibratory powder feeder may further include a process gas input flow line. The process gas input flow line facilitates the flow of a process gas, such as, for example, feeder compressed dry air (FCDA), in addition to the typical inert carrier gas, into the vibratory powder feeder. A combination of the process gas, the carrier gas and the powder then flows from the vibratory powder feeder to the vaporizer unit.

In another example embodiment, the improved feeder system may include a process gas input flow line for use during conventional VTD processes that include Si doping as noted above. This process gas input flow line may be used with an embodiment having a carrier gas bypass line that allows continuous flow of carrier gas to the vaporizer unit during refill or maintenance of the vibratory powder feeder to prevent clogging of the inlets into the vaporizer unit.

In addition, an interlock system can also be provided in association with the embodiments described above. The interlock system controls operation of key components of the vibratory powder feeder to prevent unintentional operation errors and to improve safety during refill and maintenance of the vibratory powder feeder.

Figure 3:
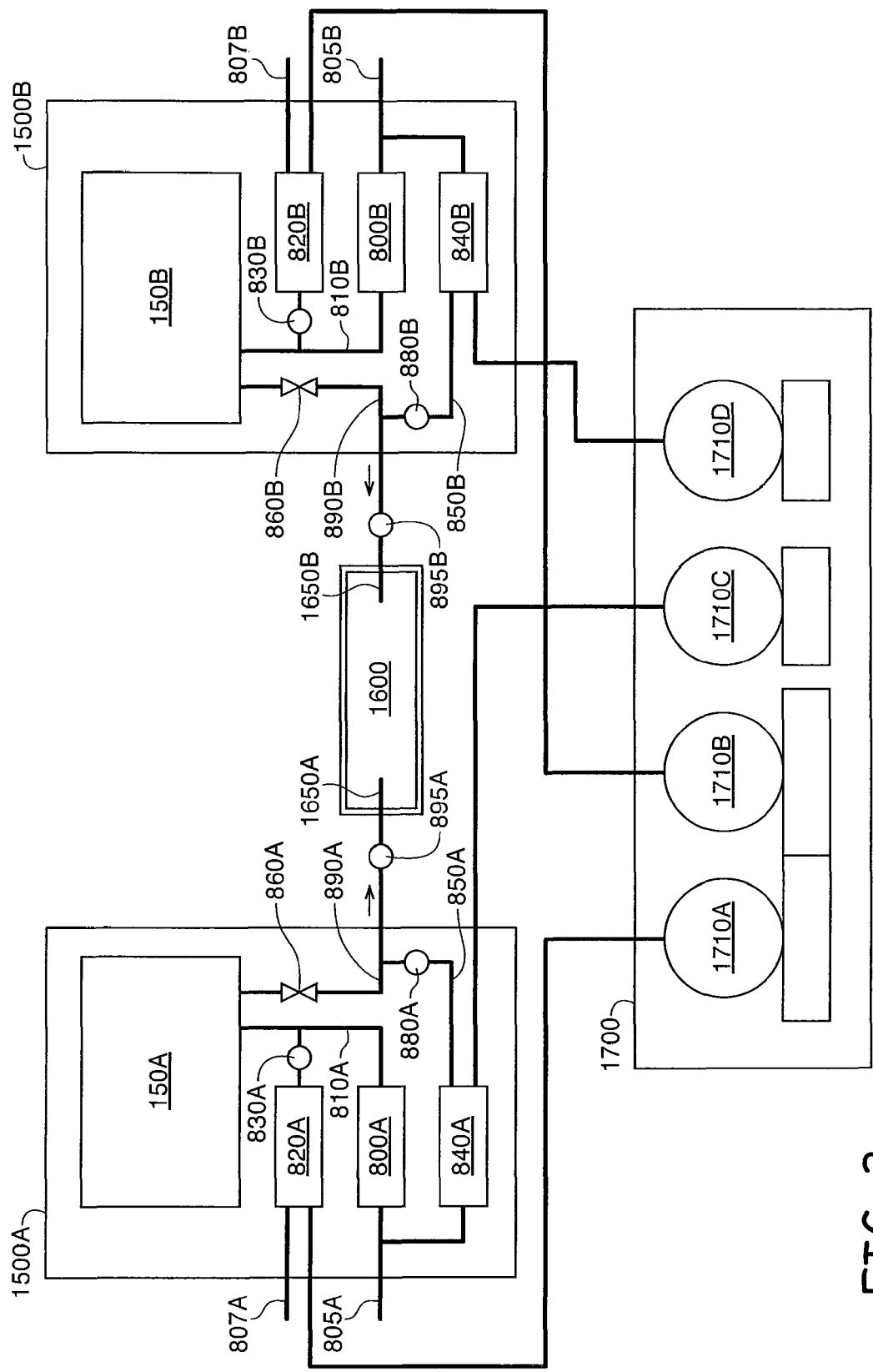
FIG. 3 is a schematic diagram of an embodiment of a vapor transport deposition (VTD) system.

At the outset it should be noted that FIG. 3 depicts the structures of each of the embodiments described above, used in combination. Thus, as explained below, FIG. 3 illustrates a carrier gas bypass flow line and associated structures, a process gas input flow line and associated structures, and an interlock system. Although the carrier gas bypass flow line and process gas input flow line are used together in the FIG. 3 structure, each can be used without the other as well, and each can be used with or without the interlock system.

FIG. 3 illustrates a deposition system in which a vaporizer unit 1600 has inlets 1650A, 1650B at either end for receiving powdered material and gas flow from respective material and gas flow providers 1500A, 1500B. Each of the providers 1500A, 1500B includes respective semiconductor material vibratory units 150A, 150B which hold a semiconductor material powder for flow into vaporizer unit 1600. Each of the providers 1500A, 1500B also includes respective carrier gas input flow lines 810A, 810B which receive a carrier gas through respective carrier gas mass flow controllers 800A, 800B. The carrier gas is provided to carrier gas mass flow controllers 800A, 800B at respective input lines 805A, 805B. Each of the providers 1500A, 1500B further includes a respective carrier gas bypass flow line 850A, 850B which respectively receives bypass carrier gas from a carrier gas bypass mass flow controller 840A, 840B and which are connected at input sides to respective input lines 805A, 805B. The carrier gas bypass input lines 850A, 850B are respectively connected to output lines 890A, 890B of the providers 1500A, 1500B through respective particle filters 880A, 880B. The output lines also receive carrier gas and semiconductor material from vibratory units 150A, 150B through respective flow-valves 860A, 860B. Flow-valves 860A, 860B may be shut-off valves which open or close to restrict or allow flow of carrier gas and semiconductor material from vibratory units 150A, 150B into output lines 890A, 890B. Particle filters 880A, 880B prevent semiconductor material powder from back-streaming into carrier gas bypass input lines 850A, 850B. The output lines 890A, 890B are respectively connected to vaporizer inlets 1650A, 1650B through flow-valves 895A, 895B. Flow-valves 895A, 895B may be shut-off valves which open or close to restrict or allow flow of carrier gas and/or semiconductor material from output lines 890A, 890B into vaporizer inlets 1650A, 1650B.

The raw material that is processed by the powder vibratory units 150A, 150B as a powder can be a semiconductor, for example, a transition metal (Group 12) and a chalcogenide (Group 18) such as cadmium sulfide (CdS) or cadmium telluride (CdTe). Powders can include a plurality of particles having average sizes in a range of, for example, about 10 to about 600 micrometers. Additional materials that can be utilized to form a semiconductor film may be used with these systems and methods. Dopants may also be useful to enhance the deposition and properties of the deposited product. Suitable dopants may include silicon (Si).

The inert carrier gases input in lines 805A, 805B can be connected to a helium gas source, which has been found to increase the glass temperature range and the pressure range that provide film characteristics such as deposition density and good bonding. The inert carrier gas can also be another inert gas such as nitrogen, neon, argon or krypton, or combinations of these gases. It is also possible for the carrier gas to be mixed with and include some amount of a reactive gas such as oxygen that can advantageously affect growth properties of the material. A flow rate of about 0.3 to about 10 slpm of the carrier gas has been determined to be sufficient to facilitate flow of the powder out of the powder vibratory units 150A, 150B and to the vaporizer unit 1600.

FIG. 3 also illustrates an embodiment where a dopant material, such as Si, may be included in the powder mix which is fed to vaporizer unit 1600. In this case, a process gas is added to the carrier gas in respective carrier gas flow lines 810A, 810B. For an Si dopant, the process gas is feeder compressed dry air (FCDA) which enters the providers 1500A, 1500B at respective inlets 807A, 807B through respective process gas mass flow controllers 820A, 820B. The outputs of process gas mass flow controllers 820A, 820B flow into respective vibratory units 150A, 150B through respective valves 830A, 830B. The process gas can also be vaporized water. If the process gas is FCDA, a flow rate of about 0 to about 20 sccm of the process gas has been determined to be sufficient to produce a desired mix of $SiTe_x$ (gas) and $SiO_2$ (solid). If the process gas is vaporized water in a carrier gas, a flow rate of about 0.3 to about 10 slpm of the mixture of the process gas and the carrier gas has been determined to be sufficient.

According to disclosed embodiments, a vibratory powder feeder system may further include an interlock system. An interlock system can control certain components of the vibratory powder feeder. The interlock system can be connected to at least any two of the components of the vibratory powder feeder, including, but not limited to, the respective semiconductor material vibratory units 150A, 150B, the respective carrier gas mass flow controllers 800A, 800B, the respective process gas mass flow controllers 820A, 820B, the respective carrier gas bypass mass flow controllers 840A, 840B and the respective valves 830A, 830B. The interlock system can use a hardware based control module or a software based control module to control the components of the vibratory powder feeder. The certain conditions that can determine whether the interlock device activates or deactivates a component of the vibratory powder feeder can include another component's activation (on/off), pressure within another component as measured by a sensor in the component, temperature within another component as measure by a sensor in the component and flow rate within another component as measured by a sensor within the component.

In the embodiment shown in FIG. 3, the vibratory powder feeder system includes an interlock system 1700. The interlock system 1700 includes multiple control modules 1710A, 1710B, 1710C, 1710D connected to components of the providers 1500A, 1500B. Each control module 1710A, 1710B, 1710C, 1710D connects to a separate component of the providers 1500A, 1500B. In the illustrated embodiment, the first control module 1710A is connected to the process gas mass flow controller 820A, the second control module 1710B is connected to the process gas mass flow controller 820B, the third control module 1710C is connected to the first carrier gas bypass mass flow controller 840A and the forth control module 1710D is connected to the second carrier gas bypass mass flow controller 840B. It should be noted that although separate modules 1710A, 1710B, 1710C and 1710D are shown, they may be combined into fewer control modules or into a single control module which provides the functions of each of the control modules 1710A, 1710B, 1710C and 1710D. Also, the function of control modules 1710A, 1710B, 1710C and 1710D can be implemented in hardware, software or a combination of each.

Control modules 1710A, 1710B respectively control the process gas mass flow controllers 820A, 820B using sensors which respectively sense (a) whether the respective carrier gas mass flow controllers 800A, 800B are on or off and (b) whether respective flow-valves 860A, 860B are on or off. Control modules 1710A, 1710B will turn off the process gas mass flow controllers 820A, 820B when the respective carrier gas mass flow controllers 800A, 800B are off or when respective flow-valves 860A, 860B are off.

Control modules 1710C, 1710D respectively control the carrier bypass mass flow controllers 840A, 840B and sense (a) through a pressure sensor the pressure in carrier gas flow lines 810A, 810B or carrier gas bypass flow line 850A, 850B, (b) the on or off condition of respective flow-valves 860A, 860B, and (c) the temperature of the vaporizer unit 1600. Control modules 1710C, 1710D respectively turn off the bypass mass flow controllers 840A, 840B when the pressure in respective output lines 890A, 890B exceed a predetermined value or when the respective flow-valve 860A, 860B is on. Alternatively, control modules 1710C, 1710D can also respectively turn off the material vibratory units 150A, 150B when the temperature of the vaporizer unit 1600 is less than a predetermined value or control modules 1710C, 1710D can respectively turn off mass flow controller 800a, 800b when a manual input or a digital/analog signal indicates that a technician is checking the vaporizer unit 1600 for leaks.

Figure 1:
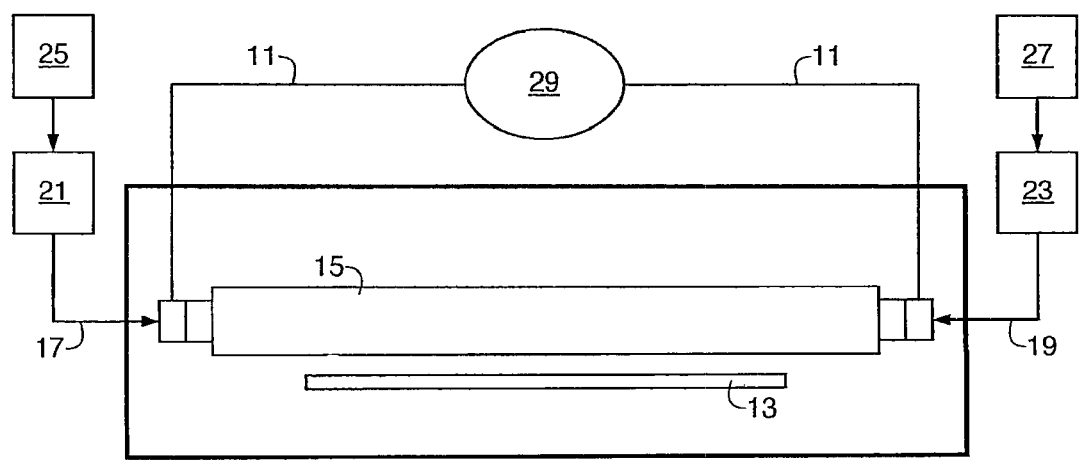
FIG. 1 is a schematic of a conventional vapor transport deposition (VTD) system with multiple vibratory powder feeders.
Figure 2A:
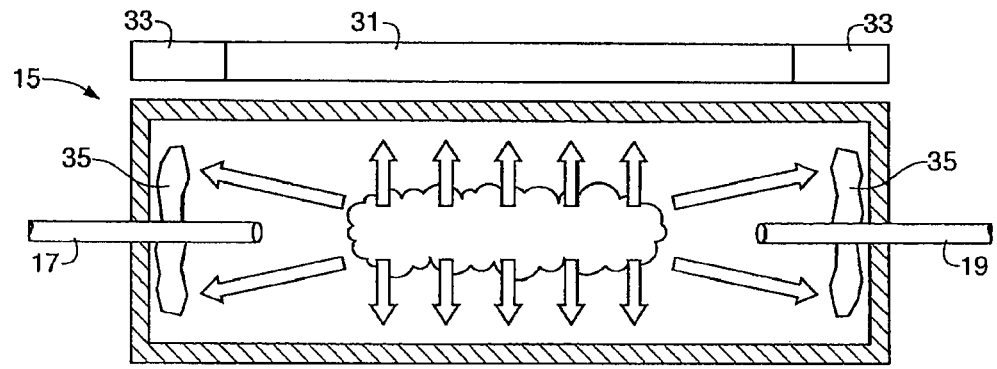
FIGS. 2A and 2B illustrate the internal operation of the vaporizer unit shown in FIG. 1.
Figure 2B:
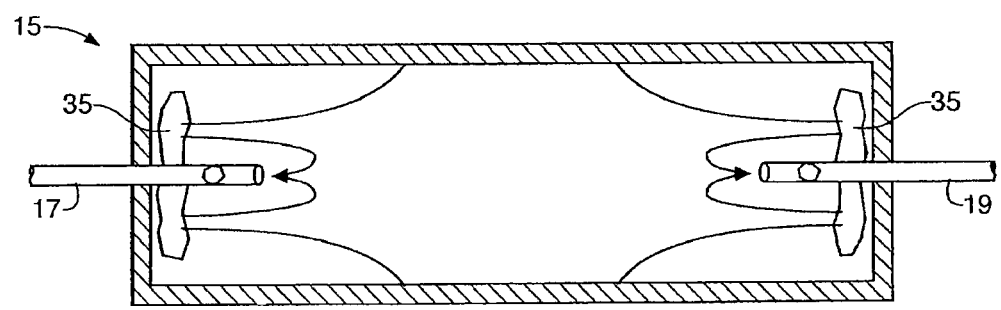

The carrier gas bypass mass flow controllers 840A, 840B and associated supply lines 850A, 850B are used to supply carrier gas to vaporizer inlets 1650A, 1650B when an associated vibratory unit 150A, 150B is shut down for purposes of maintenance or refill of powder material. This mitigates against the backflow and clogging problem described above with regards to FIGS. 2A and 2B. In addition, if a dopant such as Si is added to the powder in vibratory units 150A, 150B, the mass flow controllers 820A, 820B and associated input lines 810A, 810B supply an appropriate amount of process gas to the vibratory units 150A, 150B to attain a desired gas to solid ratio of the dopant material within the vaporizer 1600.

While embodiments have been described in detail, it should be readily understood that the invention is not limited to the disclosed embodiments. Rather the embodiments can be modified to incorporate any number of variations, alterations, substitutions, or equivalent arrangements not heretofore described without departing from the spirit and scope of the invention.

What is claimed as new and desired to be protected by Letters Patent of the United States is:

1. A system comprising:
   a powder vibratory unit holding a powder material;
   a carrier gas source;
   a carrier gas input flow line for directing a carrier gas from the carrier gas source into the powder vibratory unit;
   an output flow line for directing an powder output of the powder vibratory unit to a vaporizer unit; and
   a carrier gas bypass flow line including a device for selectively directing a carrier gas from the carrier gas source into the vaporizer unit and bypassing the powder vibratory unit;
   a particle filter coupled to the carrier gas bypass flow line to prevent powder from flowing from the output flow line into the carrier gas bypass flow line.

2. The system of claim 1, further comprising
   a first mass flow controller coupled to the carrier gas input flow line for regulating a flow of carrier gas into the powder vibratory unit; and
   a second mass flow controller coupled to a carrier gas bypass flow line for regulating a flow of bypass carrier gas into the vaporizer unit.

3. The system of claim 2, further comprising
   a flow-valve coupled to the output flow line for regulating the flow of a combination of carrier gas and powder out of the powder vibratory unit.

4. The system of claim 3, wherein the flow-valve is a shut-off valve for restricting or allowing the flow of a combination of carrier gas and powder out of the powder vibratory unit.

5. The system of claim 2, further comprising
   a valve coupled to the output flow line and to the carrier bypass flow line for regulating the flow of carrier gas and/or powder into the vaporizer unit.

6. The system of claim 2, further comprising
   an interlock system for controlling the operation of components of the system.

7. The system of claim 6, wherein the interlock system controls the operation of the first mass flow controller and the second mass flow controller.

8. The system of claim 1, further comprising a process gas input flow line for directing a process gas into the powder vibratory unit.

9. The system as in claim 8, further comprising a controller for regulating flow of the process gas into the powder vibratory unit.

10. The system as in claim 8, further comprising:
    a first mass flow controller coupled to the carrier gas input flow line for regulating a flow of carrier gas into the powder vibratory unit;
    a second mass flow controller coupled to the process gas input flow line for regulating a flow of the process gas into the powder vibratory unit; and
    a third mass flow controller coupled to the carrier gas bypass flow line for regulating a flow of bypass carrier gas into the vaporizer unit.

11. The system as in claim 1, further comprising a flow-valve coupled to the output flow line for regulating the flow of a combination of carrier gas and powder from the powder vibratory unit.

12. The system as in claim 1, further comprising a flow-valve coupled to the output flow line and to the carrier bypass flow line for regulating the flow of carrier gas and/or powder into the vaporizer unit.

13. A system comprising:
    a powder vibratory unit holding a powder material;
    a carrier gas source;
    a carrier gas input flow line for directing a carrier gas from the carrier gas source into the powder vibratory unit;
    an output flow line for directing an output of the powder vibratory unit to a vaporizer unit;

a carrier gas bypass flow line including a device for selectively directing a carrier gas from the carrier gas source into the vaporizer unit and bypassing the powder vibratory unit; and a particle filter coupled to the carrier gas bypass flow line to prevent powder from back-streaming from the output flow line into the carrier gas bypass flow line.

14. The system as in claim 10, further comprising an interlock system for controlling operation of at least one of said powder vibratory unit, first mass flow controller, second mass flow controller and third mass flow controller.

15. The system as in claim 14, wherein the interlock system further comprises a sensor for sensing whether said first mass flow controller is on or off, wherein when the first mass flow controller is off, the interlock system turns off the second mass flow controller.

16. The system as in claim 14, wherein the interlock system further comprises a pressure sensor for sensing the pressure in the carrier gas bypass flow line, wherein when the pressure sensor senses a pressure in the carrier gas bypass flow line that exceeds a predetermined value, the interlock system turns off the third mass flow controller.

17. The system as in claim 14, wherein the interlock system further comprises a sensor for sensing the temperature of the vaporizer unit, wherein when the sensor senses an average temperature of the vaporizer unit that is less than a predetermined value the interlock system turns off the first powder vibratory unit.

\* \* \* \* \*